(12) United States Patent
Hatano

(10) Patent No.: US 10,685,875 B2
(45) Date of Patent: Jun. 16, 2020

(54) SEMICONDUCTOR DEVICE HAVING MULTIPLE LATERAL ANTI-DIFFUSION FILMS

(71) Applicant: TOSHIBA MEMORY CORPORATION, Minato-ku, Tokyo (JP)

(72) Inventor: Masaaki Hatano, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/100,646

(22) Filed: Aug. 10, 2018

(65) Prior Publication Data

US 2019/0244856 A1 Aug. 8, 2019

(30) Foreign Application Priority Data

Feb. 7, 2018 (JP) ................................. 2018-020308

(51) Int. Cl.
| | |
|---|---|
| *H01L 23/532* | (2006.01) |
| *H01L 21/76* | (2006.01) |
| *H01L 21/10* | (2006.01) |
| *H01L 21/768* | (2006.01) |
| *H01L 29/12* | (2006.01) |

(Continued)

(52) U.S. Cl.
CPC .. *H01L 21/76846* (2013.01); *H01L 21/02362* (2013.01); *H01L 21/3065* (2013.01); *H01L 21/76256* (2013.01); *H01L 23/53238* (2013.01); *H01L 25/00* (2013.01); *H01L 29/12* (2013.01); *H01L 21/76852* (2013.01);

(Continued)

(58) Field of Classification Search
CPC ......... H01L 23/53238; H01L 23/53223; H01L 23/53252; H01L 23/53266; H01L 21/76852; H01L 2221/1078
See application file for complete search history.

(56) References Cited

U.S. PATENT DOCUMENTS 8,492,265 B2 * 7/2013 Yang ....................... H01L 24/03
                                                                438/618
8,896,125 B2 * 11/2014 Kagawa ................ H01L 23/528
                                                                257/774

(Continued)

FOREIGN PATENT DOCUMENTS

JP          2014-003081 A        1/2014

*Primary Examiner* — Ida M Soward
(74) *Attorney, Agent, or Firm* — Foley & Lardner LLP

(57) ABSTRACT

A semiconductor device includes a first semiconductor substrate, a first insulating film provided at the first semiconductor substrate and including a first recess portion on a surface portion thereof, a first metal film provided at the first recess portion and having a first surface exposed from the first insulating film, a second semiconductor substrate, a second insulating film provided at the second semiconductor substrate and including a second recess portion on a surface portion thereof, a second metal film provided at the second recess portion and having a second surface exposed from the second insulating film, first anti-diffusion films, and second anti-diffusion films provided at outer circumferential portions of the first anti-diffusion films. The second surface is joined to the first surface. The first anti-diffusion films are provided at the first recess portion and the second recess portion and cover the first metal film and the second metal film.

6 Claims, 4 Drawing Sheets

(51) Int. Cl.
    *H01L 21/3065* (2006.01)
    *H01L 21/762* (2006.01)
    *H01L 21/02* (2006.01)
    *H01L 25/00* (2006.01)

(52) U.S. Cl.
    CPC .. *H01L 23/53223* (2013.01); *H01L 23/53252* (2013.01); *H01L 23/53266* (2013.01)

(56) References Cited

U.S. PATENT DOCUMENTS

| | | | | |
|---|---|---|---|---|
| 9,027,821 | B2* | 5/2015 | Di Cioccio | H01L 21/2007 |
| | | | | 228/120 |
| 9,142,517 | B2* | 9/2015 | Liu | H01L 24/80 |
| 9,224,704 | B2* | 12/2015 | Landru | H01L 24/03 |
| 9,240,330 | B2 | 1/2016 | Takeda et al. | |
| 9,276,195 | B2* | 3/2016 | Kanaya | H01L 43/02 |
| 9,318,438 | B2* | 4/2016 | Bossler | H01L 23/5384 |
| 9,443,802 | B2* | 9/2016 | Kagawa | H01L 21/76807 |
| 9,520,361 | B2* | 12/2016 | Kang | H01L 27/14621 |
| 9,716,076 | B2* | 7/2017 | Hagimoto | H01L 27/14634 |
| 9,799,587 | B2* | 10/2017 | Fujii | H01L 23/522 |
| 9,865,545 | B2* | 1/2018 | Rivoire | H01L 21/30625 |
| 2006/0220197 | A1* | 10/2006 | Kobrinsky | H01L 21/76852 |
| | | | | 257/678 |
| 2009/0278259 | A1* | 11/2009 | Kouno | H01L 21/76835 |
| | | | | 257/751 |
| 2013/0203187 | A1* | 8/2013 | Matsuoka | H01L 27/228 |
| | | | | 438/3 |
| 2015/0108648 | A1 | 4/2015 | Tsumura et al. | |
| 2015/0348911 | A1* | 12/2015 | Xiao | H01L 23/53276 |
| | | | | 257/751 |
| 2019/0109042 | A1* | 4/2019 | Katkar | H01L 21/76843 |

* cited by examiner

SEMICONDUCTOR DEVICE HAVING MULTIPLE LATERAL ANTI-DIFFUSION FILMS

CROSS-REFERENCE TO RELATED APPLICATION

This application claims the benefit of and priority to Japanese Patent Application No. 2018-020308, filed Feb. 7, 2018, the entire contents of which are incorporated herein by reference.

FIELD

Embodiments described herein relate generally to a semiconductor device.

BACKGROUND

A bonding technique is heretofore known which bonds a plurality of semiconductor substrates together. In this bonding technique, a semiconductor substrate having a semiconductor element, such as a memory, formed therein and a semiconductor substrate having a peripheral circuit for the semiconductor element formed therein are bonded together. In bonding the semiconductor substrates, metal films serving as pads may be joined together. The surface of each metal film except a junction surface may be covered with an insulating film.

DETAILED DESCRIPTION

In the above-mentioned bonding technique, a misregistration can occur between metal films. If such a misregistration occurs, a metal may in some cases diffuse into an insulating film from a part of the junction surface. In these cases, a decrease in reliability such as time dependent dielectric breakdown (TDDB) may be caused.

Embodiments provide a semiconductor device capable of improving a reliability against metallic diffusion.

In general, according to some embodiments, a semiconductor device may include a first semiconductor substrate, a first insulating film, a first metal film, a second semiconductor substrate, a second insulating film, a second metal film, first anti-diffusion films, and second anti-diffusion films. The first insulating film may be provided at the first semiconductor substrate and may include a first recess portion on a surface portion thereof. The first metal film may be provided at the first recess portion and may have a first surface exposed from the first insulating film. The second insulating film may be provided at the second semiconductor substrate and may include a second recess portion on a surface portion having a surface joined to a surface of the first insulating film. The second metal film may be provided at the second recess portion and may have a second surface exposed from the second insulating film, and the second surface may be joined to the first surface. The first anti-diffusion films may be provided at the first recess portion and the second recess portion and may cover the first metal film and the second metal film. The second anti-diffusion films may be provided at outer circumferential portions of the first anti-diffusion films.

Hereinafter, embodiments of the present disclosure will be described with reference to the drawings. The following embodiments should not be construed to limit the present disclosure.

Figure 1:
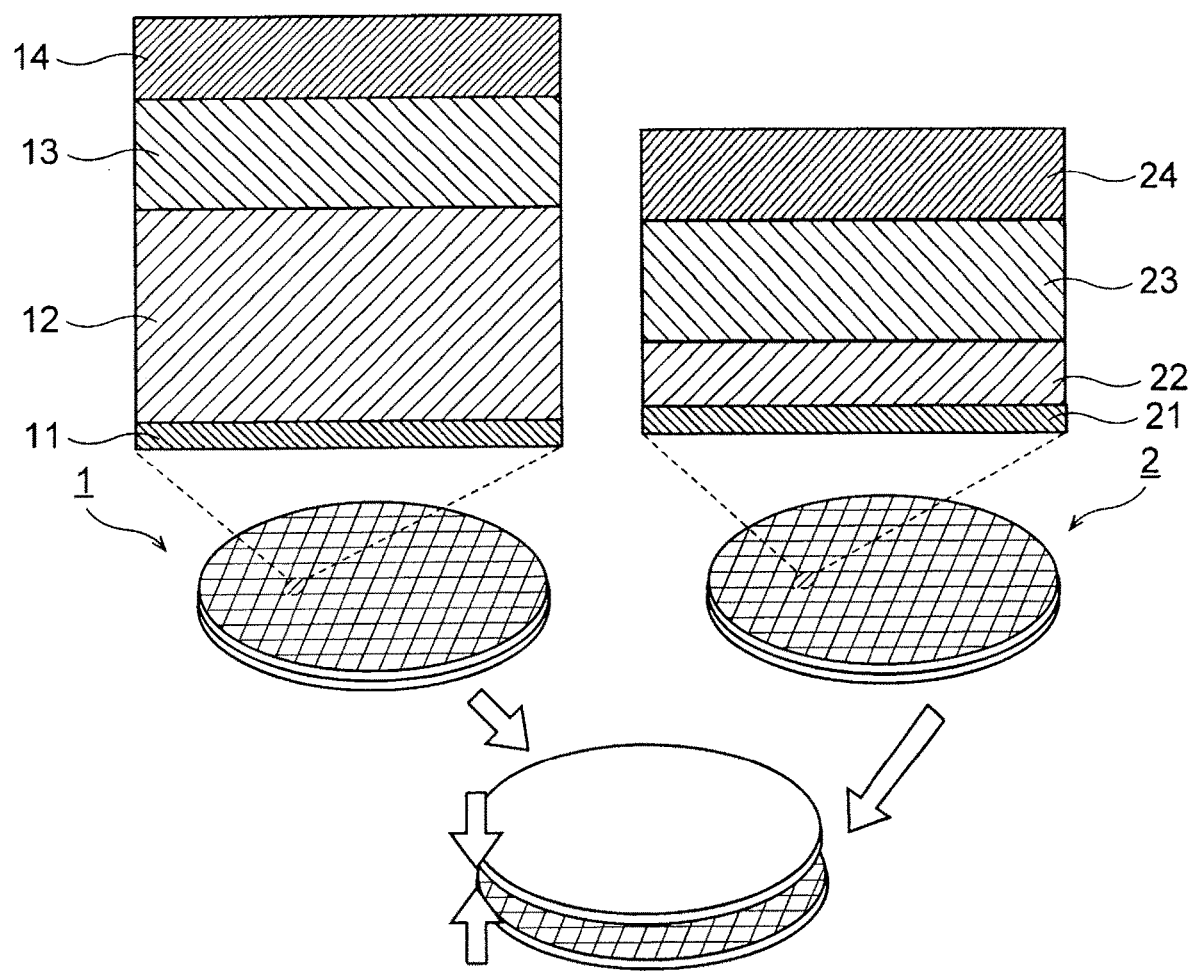
FIG. 1 is a schematic diagram used to describe a semiconductor device according to some embodiments.

FIG. 1 is a schematic diagram used to describe a semiconductor device according to some embodiments. As illustrated in FIG. 1, the semiconductor device according to some embodiments includes a first semiconductor member 1 and a second semiconductor member 2 bonded together. Each of the first semiconductor member 1 and the second semiconductor member 2 may be formed in the shape of a wafer having a plurality of semiconductor chips.

In the first semiconductor member 1, a semiconductor element layer 12, an interconnection layer 13, and a pad layer may be formed on a semiconductor substrate 11. The semiconductor element layer 12 may have a semiconductor element formed therein. For example, the semiconductor element is a three-dimensional semiconductor memory. Such a three-dimensional semiconductor memory may include a stacked body in which electrode films (not illustrated) and insulating films (not illustrated) are alternately stacked in layers. Moreover, a function film which retains electrons may be formed in a hole penetrating the stacked body. An interconnection connected to the above-mentioned semiconductor element may be formed in the interconnection layer 13. A pad connected to the interconnection may be formed in the pad layer 14.

In the second semiconductor member 2, a semiconductor element layer 22, an interconnection layer 23, and a pad layer 24 may be formed on a semiconductor substrate 21. A drive element for driving the semiconductor element of the semiconductor element layer 12 may be formed in the semiconductor element layer 22. For example, a transistor can be used as such a drive element. An interconnection connected to the drive element may be formed in the interconnection layer 23. A pad connected to the interconnection may be formed in the pad layer 24.

In some embodiments, the pad layer 14 and the pad layer 24 may be joined to each other by bonding the first semiconductor member 1 and the second semiconductor member 2 together. Hereinafter, a configuration of such a junction portion is described with reference to FIG. 2A and FIG. 2B.

Figure 2A:
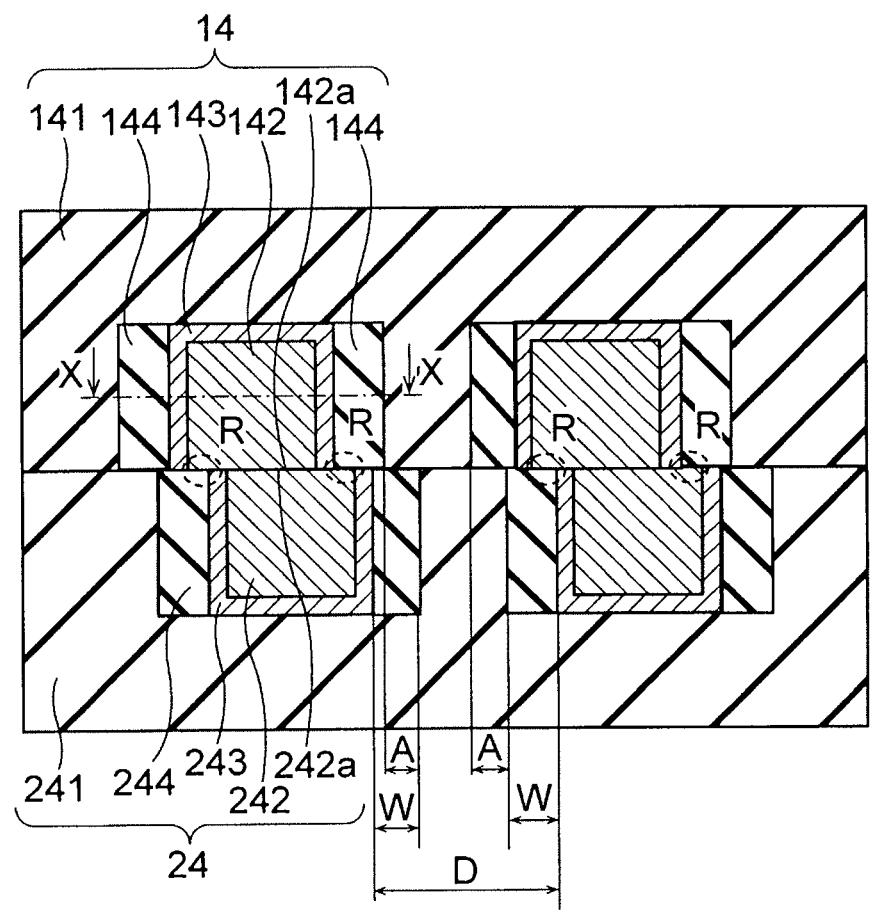
FIG. 2A is a sectional view illustrating a junction portion of the semiconductor device according to some embodiments.
Figure 2B:
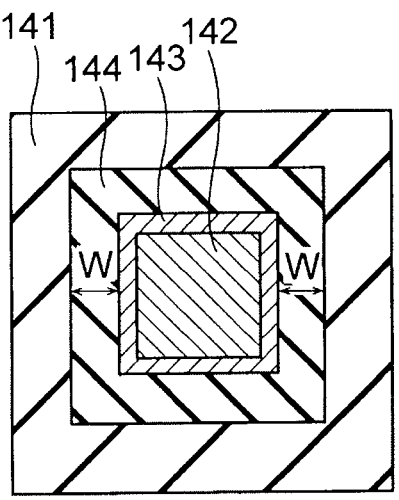
FIG. 2B is a sectional view taken along a section line X-X illustrated in FIG. 2A.

FIG. 2A is a sectional view illustrating a junction portion of the semiconductor device according to some embodiments. FIG. 2B is a sectional view taken along a section line X-X illustrated in FIG. 2A.

As illustrated in FIG. 2A and FIG. 2B, the pad layer includes an insulating film 141, a metal film 142, an anti-diffusion film 143, and an anti-diffusion film 144. The pad layer 24 may include an insulating film 241, a metal film 242, an anti-diffusion film 243, and an anti-diffusion film 244.

The insulating film 141 may be equivalent to a first insulating film, and the insulating film 241 may be equivalent to a second insulating film. Each of the insulating film 141 and the insulating film 241 may be formed as, for example, a silicon dioxide film ($SiO_2$). These insulating films may be joined to each other.

The metal film 142 may be equivalent to a first metal film, and the metal film 242 may be equivalent to a second metal film. Each of the metal film 142 and the metal film 242 may be formed as, for example, a single-layer film or multi-layer film of a metal, such as copper (Cu) or cobalt (Co). In some embodiments, a plurality of metal films 142 and a plurality of metal films 242 may be respectively arrayed along the same direction (or one direction).

Moreover, the metal film 142 may have a surface 142a exposed from the insulating film 141, and the metal film 242 may have a surface 242a exposed from the insulating film 241. The surface 142a may be equivalent to a first surface, and the surface 242a may be equivalent to a second surface. The surface 142a and the surface 242a may be joined to each other.

The anti-diffusion film 143 and the anti-diffusion film 243 may be equivalent to first anti-diffusion films. Each of the anti-diffusion film 143 and the anti-diffusion film 243 may be, for example, a barrier film formed as, for example, a film of high-melting-point metal, such as tantalum (Ta), niobium (Nb), titanium (Ti), tungsten (W), or vanadium (V), a nitride film of high-melting-point metal, or a stacked film of, for example, high-melting-point metal and nitride of high-melting-point metal. The anti-diffusion film 143 may cover the metal film 142 inside the insulating film 141. This enables preventing a metal contained in the metal film 142 from diffusing into the insulating film 141. On the other hand, the anti-diffusion film 243 may cover the metal film 242 inside the insulating film 241. This enables preventing the metal film 242 from diffusing into the insulating film 241.

The anti-diffusion film 144 and the anti-diffusion film 244 may be equivalent to second anti-diffusion films. Each of the anti-diffusion film 144 and the anti-diffusion film 244 may be formed as a film having a function of performing copper (Cu) diffusion. For example, a nitride film of insulation properties, such as a silicon nitride film (SiN) or a silicon carbonitride film (SiCN), can be used. Moreover, an electrically conductive film, such as a film of high-melting-point metal, such as tantalum (Ta), niobium (Nb), titanium (Ti), tungsten (W), or vanadium (V), a nitride film of high-melting-point metal, or a stacked film of, for example, high-melting-point metal and nitride of high-melting-point metal, can also be used. Furthermore, as such an electrically conductive film, the same type of film as the anti-diffusion film 143 and the anti-diffusion film 243 can be used. The anti-diffusion film 144 may be provided on an outer circumferential portion of the anti-diffusion film 143. On the other hand, the anti-diffusion film 244 may be provided on an outer circumferential portion of the anti-diffusion film 243.

Hereinafter, a partial manufacturing process for the semiconductor device according to some embodiments is described with reference to FIG. 3 to FIG. 6. Here, a manufacturing process for the pad layer 14 is described.

Figure 3:
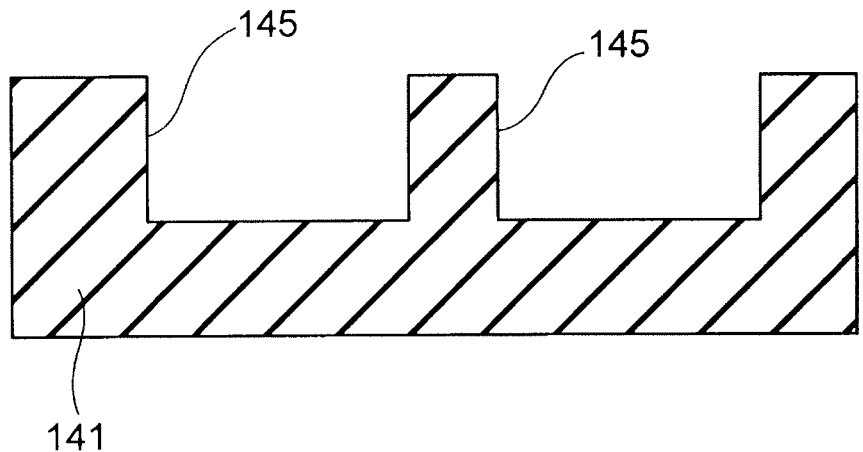
FIG. 3 is a sectional view illustrating a process of forming a recess portion on an insulating film according to some embodiments.

First, as illustrated in FIG. 3, the manufacturing process may form a recess portion (or recess portions) 145 on the insulating film 141. The recess portion 145 may be formed, for example, with use of a technique such as photolithography and reactive ion etching (RIE).

Figure 4:
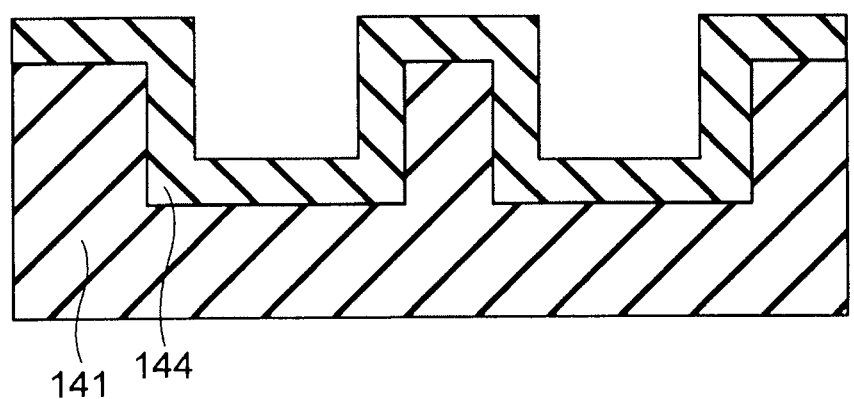
FIG. 4 is a sectional view illustrating a process of forming an anti-diffusion film on the recess portion of the insulating film according to some embodiments.

Next, as illustrated in FIG. 4, the manufacturing process may form an anti-diffusion film 144 on the inner surface of the recess portion 145 and the upper surface of the insulating film 141. The anti-diffusion film 144 may be formed, for example, with use of a technique such as chemical vapor deposition (CVD).

Figure 5:
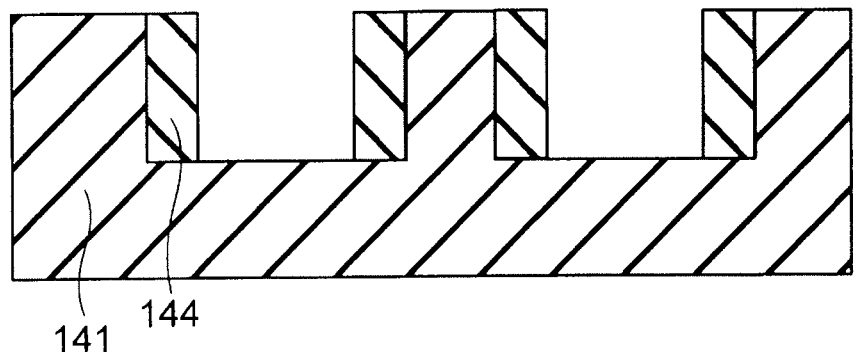
FIG. 5 is a sectional view illustrating a process of applying etch-back to the anti-diffusion film according to some embodiments.
Figure 6:
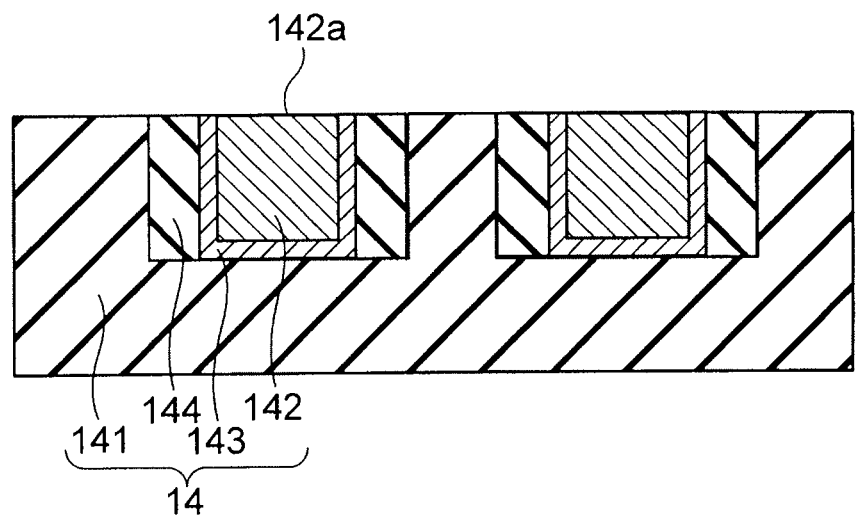
FIG. 6 is a sectional view illustrating a process of embedding an anti-diffusion film and a metal film into the recess portion according to some embodiments.

Next, as illustrated in FIG. 5, the manufacturing process may apply etch-back to the anti-diffusion film 144 in such a manner that the anti-diffusion film 144 remains only at an inner side surface (or inner side surfaces) of the recess portion 145. Finally, as illustrated in FIG. 6, the anti-diffusion film 143 and the metal film 142 may be embedded into the recess portion 145. The anti-diffusion film 143 may be embedded into the recess portion 145 and then the metal film 142 may be embedded on the embedded anti-diffusion film 143.

The pad layer 24 may be formed by a manufacturing process similar to the above-described manufacturing process for the pad layer 14. Then, referring back to FIG. 2A, the surface 142a of the metal film 142 and the surface 242a of the metal film 242 may be joined to each other, and the insulating film 141 and the insulating film 241 may be also joined to each other. At this time, as illustrated in FIG. 2A, a misregistration can occur between the metal film 142 and the metal film 242.

However, according to some embodiments, as apparent from a region R illustrated in FIG. 2A, a misregistration portion of each metal film may be in contact with the anti-diffusion film 144 or the anti-diffusion film 244. Therefore, metallic diffusion which would occur from the misregistration portion can be prevented.

Furthermore, depending on materials of the anti-diffusion film 144 and the anti-diffusion film 244, sufficient joining force between these anti-diffusion films may not be obtainable.

Therefore, in some embodiments, as illustrated in FIG. 2A, the width W of each of the anti-diffusion film 144 and the anti-diffusion film 244 may be larger than an allowable value A of the misregistration and may be smaller than ⅓ of a distance D. Here, the distance D is the shortest distance (or a minimum distance) between the anti-diffusion films 143 (each covering the metal film 142) adjacent to each other or the shortest distance (or a minimum distance) between the anti-diffusion films 243 (each covering the metal film 242) adjacent to each other.

Defining the dimension of the width W to be within the above-mentioned range (i.e., smaller than ⅓ of the distance D) enables a junction portion (between the insulating film 141 and the insulating film 241) to be ensured between the respective anti-diffusion films 144 or between the respective anti-diffusion films 244. Therefore, bonding between the pad layer 14 and the pad layer 24 can be more strengthened.

MODIFICATION EXAMPLE

Figure 7:
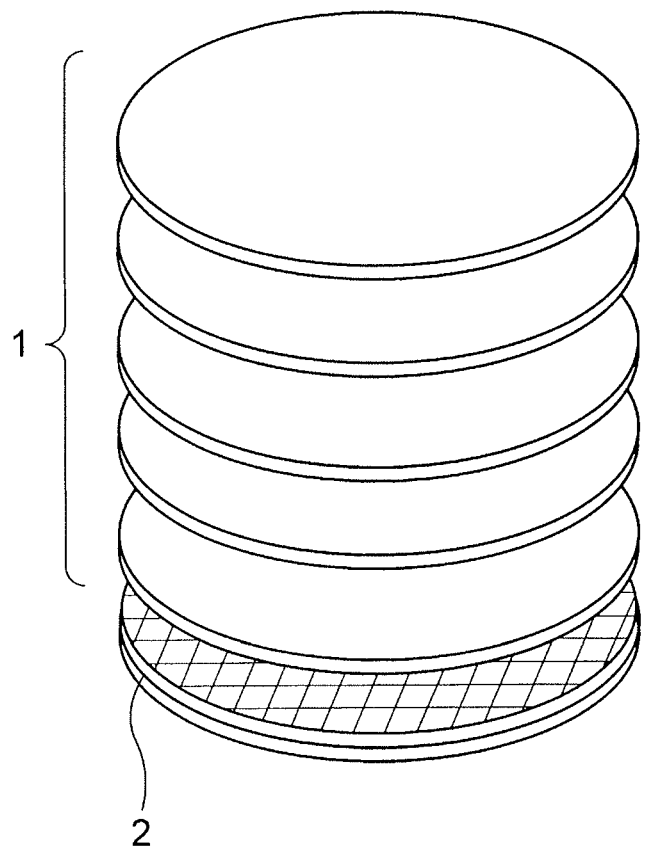
FIG. 7 is a schematic view used to describe a semiconductor device according to a modification example.

FIG. 7 is a schematic diagram used to describe a semiconductor device according to a modification example. In FIG. 7, a first semiconductor member 1 includes a plurality of semiconductor wafers stacked in layers. Each semiconductor wafer has a semiconductor element, such as a semiconductor memory, formed therein. The semiconductor device according to the present modification example includes the lowermost layer of the first semiconductor member 1 and a second semiconductor member 2 bonded together.

This semiconductor device may be provided with an anti-diffusion film 144 and an anti-diffusion film 244, as in the embodiments illustrated in FIG. 2A to FIG. 6. Therefore, even if a misregistration between metal films occurs, metallic diffusion can be avoided. Thus, an increase in reliability can be attained.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device comprising:
    a first semiconductor substrate;
    a first insulating film provided at the first semiconductor substrate and including a first recess portion on a surface portion thereof;
    a first metal film provided at the first recess portion and having a first surface exposed from the first insulating film;
    a second semiconductor substrate;
    a second insulating film provided at the second semiconductor substrate and including a second recess portion on a surface portion having a surface joined to a surface of the first insulating film;
    a second metal film provided at the second recess portion and having a second surface exposed from the second insulating film, the second surface being joined to the first surface;
    first anti-diffusion films including (1) at least one anti-diffusion film provided in the first recess portion and covering the first metal film and (2) at least one anti-diffusion film provided in the second recess portion and covering the second metal film; and
    second anti-diffusion films provided at outer circumferential portions of the first anti-diffusion films.

2. The semiconductor device according to claim 1, wherein a plurality of first metal films each corresponding to the first metal film and a plurality of second metal films each corresponding to the second metal film are respectively arrayed along one direction.

3. The semiconductor device according to claim 1, wherein a width of each of the second anti-diffusion films is smaller than ⅓ of a minimum distance between anti-diffusion films of the first anti-diffusion films that are adjacent to each other and cover the first metal film.

4. The semiconductor device according to claim 1, wherein a width of each of the second anti-diffusion films is smaller than ⅓ of a minimum distance between anti-diffusion films of the first anti-diffusion films that are adjacent to each other and cover the second metal film.

5. The semiconductor device according to claim 1, wherein each of the second anti-diffusion films is a nitride film.

6. The semiconductor device according to claim 5, wherein the nitride film is a silicon nitride film or a silicon carbonitride film.

* * * * *